(12) United States Patent
Miyazaki

(10) Patent No.: US 6,759,271 B2
(45) Date of Patent: Jul. 6, 2004

(54) FLIP CHIP TYPE SEMICONDUCTOR DEVICE AND METHOD OF MANUFACTURING THE SAME

(75) Inventor: Takashi Miyazaki, Tokyo (JP)

(73) Assignee: NEC Electronics Corporation, Kawasaki (JP)

(*) Notice: Subject to any disclaimer, the term of this patent is extended or adjusted under 35 U.S.C. 154(b) by 0 days.

(21) Appl. No.: 10/233,219

(22) Filed: Aug. 29, 2002

(65) Prior Publication Data
US 2002/0195720 A1 Dec. 26, 2002

Related U.S. Application Data

(62) Division of application No. 09/866,404, filed on May 25, 2001, now Pat. No. 6,503,779.

(30) Foreign Application Priority Data

May 26, 2000 (JP) .......................................... 2000-157432

(51) Int. Cl.[7] .............................................. H01L 21/52
(52) U.S. Cl. ....................................... 438/108; 438/124
(58) Field of Search ................................. 438/108, 124, 438/121, FOR 381, FOR 384

(56) References Cited

U.S. PATENT DOCUMENTS

| | | | |
|---|---|---|---|
| 5,200,025 A | * 4/1993 | Toei et al. ...................... 216/12 |
| 5,847,458 A | 12/1998 | Nakamura et al. | |
| 6,025,650 A | 2/2000 | Tsuji et al. | |
| 6,031,282 A | 2/2000 | Jones et al. | |
| 6,238,952 B1 | * 5/2001 | Lin ............................ 438/110 |
| 6,358,778 B1 | * 3/2002 | Shinohara .................... 438/123 |
| 6,380,062 B1 | * 4/2002 | Liu ............................. 438/613 |
| 6,451,627 B1 | * 9/2002 | Coffman ...................... 438/111 |
| 6,562,660 B1 | * 5/2003 | Sakamoto et al. ........... 438/124 |
| 2001/0008305 A1 | * 7/2001 | McLellan et al. ............ 257/692 |
| 2002/0089053 A1 | * 7/2002 | Liu et al. ..................... 257/690 |
| 2002/0094683 A1 | * 7/2002 | Su et al. ...................... 438/689 |
| 2002/0160552 A1 | * 10/2002 | Minamio et al. ............ 438/108 |

FOREIGN PATENT DOCUMENTS

JP   6-310563   11/1994

OTHER PUBLICATIONS

Chinese Office Action Dated Nov. 7, 2003.

* cited by examiner

Primary Examiner—George Fourson
(74) Attorney, Agent, or Firm—Katten Muchin Zavis Rosenman

(57) ABSTRACT

A flip chip type semiconductor device is provided with a semiconductor chip with a plurality of pad electrodes on one surface. A solder electrode is connected to each pad electrode and a metallic post is connected to each solder electrode. The surface of the semiconductor chip on a side on which the pad electrodes are provided is coated with an insulating resin layer and whole the pad electrode and solder electrode and part of the metallic post are buried in the insulating resin layer. The remaining portion of the metallic post is projected from the insulating resin layer to form a protrusion. Then, an outer solder electrode is formed so as to cover this protrusion. The outer solder electrodes are arranged in a matrix on the insulating resin layer. The height of the protrusion is made 7 to 50% of the distance between an end of the outer solder electrode and the surface of the insulating resin layer.

8 Claims, 20 Drawing Sheets

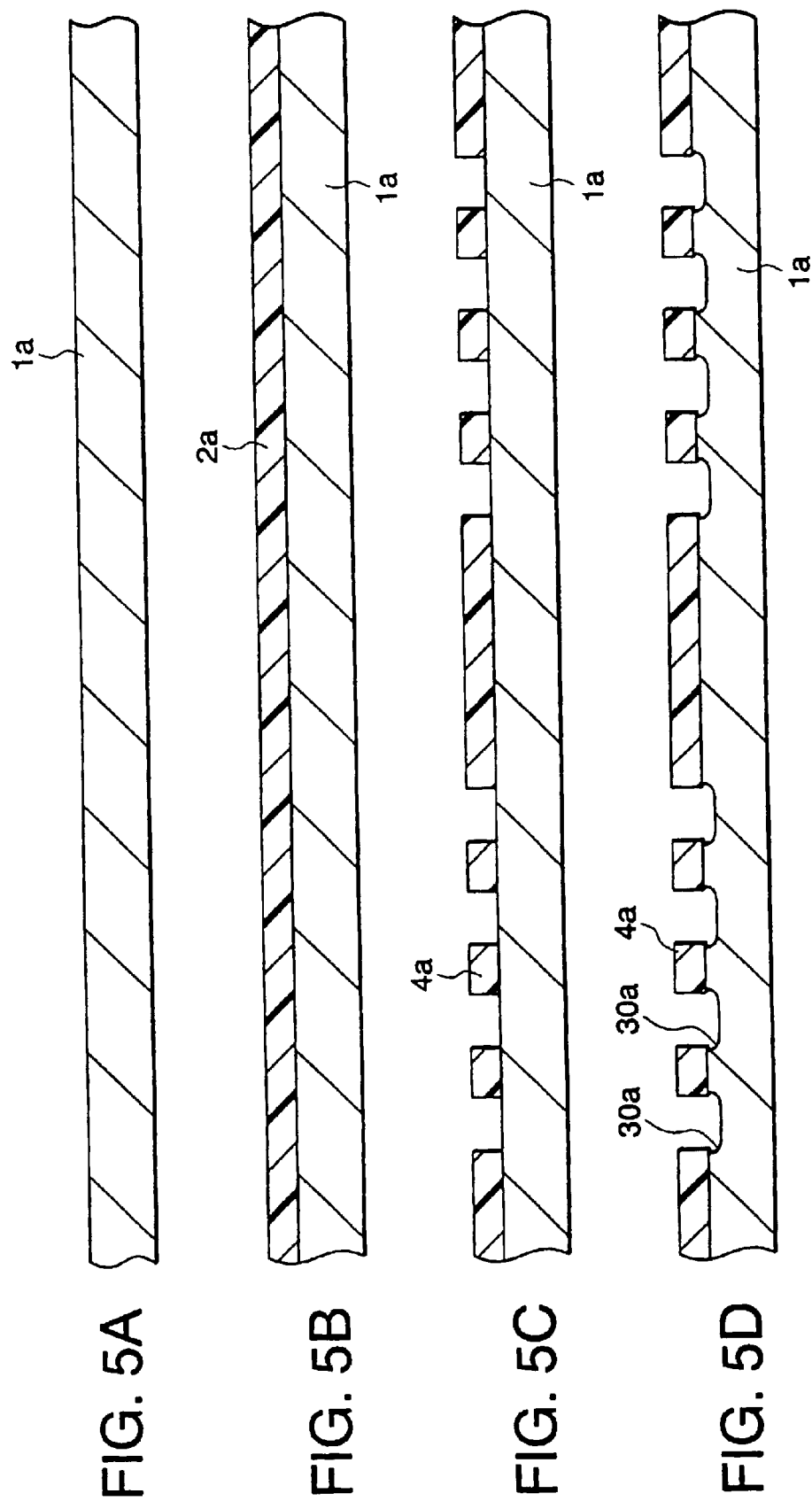

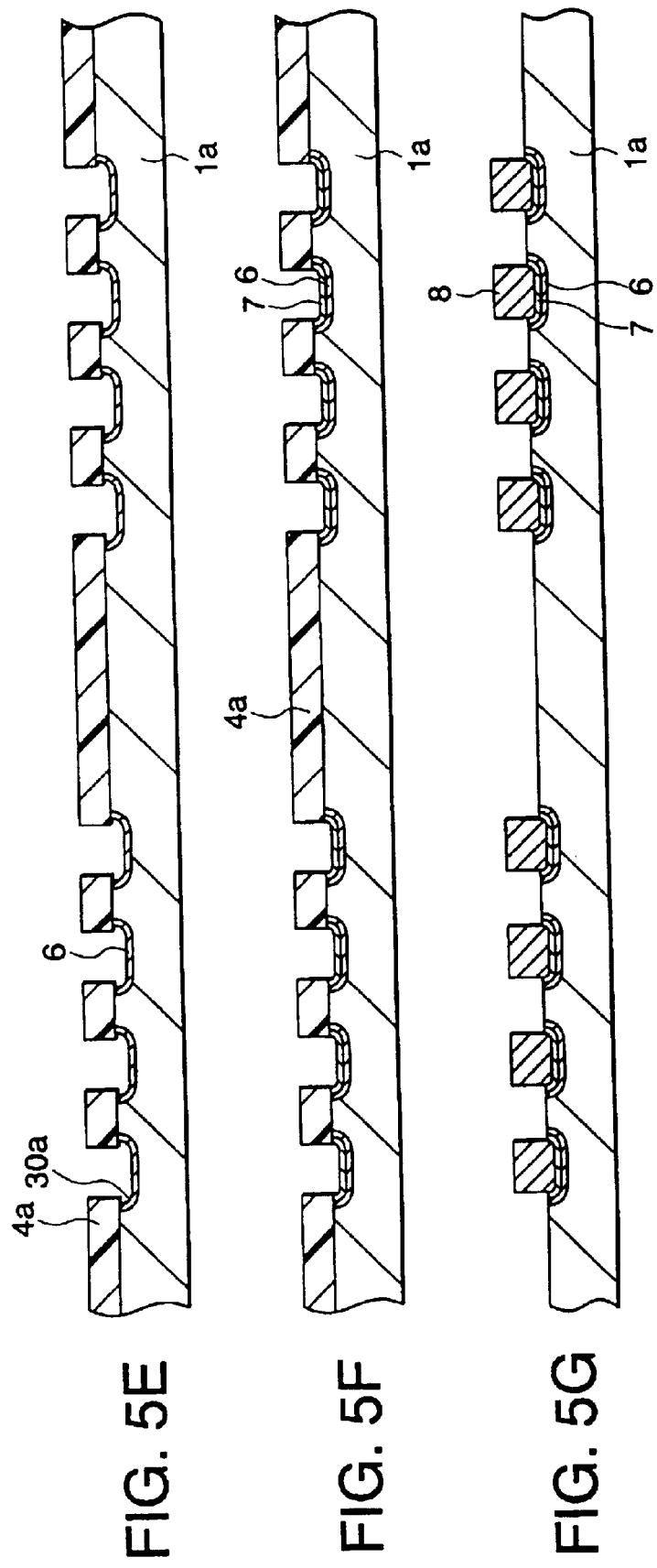

FLIP CHIP TYPE SEMICONDUCTOR DEVICE AND METHOD OF MANUFACTURING THE SAME

CROSS REFERENCE TO RELATED APPLICATION

This is a Divisional Application of application Ser. No. 09/866,404, filed on May 25, 2001, now U.S. Pat. No. 6,503,779.

BACKGROUND OF THE INVENTION

1. Field of the Invention

The present invention relates to a flip chip type semiconductor device and a method of manufacturing the same. In particular, the present invention relates to a flip chip type semiconductor device, from which a semiconductor chip can be recovered, having excellent mounting reliability, and a method of manufacturing the same.

2. Description of the Related Art

In a flip chip type semiconductor device, protruding bumps are formed with a metallic material such as a solder, Au, Sn—Ag alloys or the like on external terminals formed in the periphery of the semiconductor chip or external terminals formed in a prescribed area array on an active region. Such a flip chip type semiconductor device is mounted by an end user on a multi-layer wiring board on which electrode pads are arranged in the same pattern as the bumps on the flip chip type semiconductor device. When a solder is used as a bump material to mount the flip chip type semiconductor device on the multi-layer wiring board, in general, bonding is carried out by an IR (infrared ray) reflow process, in which a flux is used and the bumps are heated to a prescribed temperature.

However, when the flip chip type semiconductor device is mounted on the multi-layer wiring board, stress distortion occurs due to a difference in linear expansion coefficients of the multi-layer wiring board and the flip chip type semiconductor device. Consequently, cracks occur at the interface between the flip chip type semiconductor device and the bumps. Therefore, mounting reliability, particularly, a temperature cycle characteristic of the flip chip type semiconductor device is degraded. Furthermore, since thermal and mechanical stresses upon mounting are applied to the semiconductor chip as well, the semiconductor chip, particularly, a passivation film and an active region surface under the passivation film are damaged.

In order to solve these problems, a technique has been conventionally proposed that a ceramic material such as AlN (aluminum nitride), mullite, glass ceramic or the like is used as a material for the multi-layer wiring board to minimize the difference in linear expansion coefficients between the material of the multi-layer wiring board and silicon, thereby minimizing the stress distortion. Thus, mounting reliability is improved.

Even though the mounting reliability is improved, however, cost is a problem in this technique since an expensive ceramic material is used as a material for the multi-layer wiring board. Therefore, in general, application of this technique is limited to fabrication of a high-priced super computer or large-scale computer.

On the other hand, recently, a technique is widely being utilized that an organic material, which has a high linear expansion coefficient but is relatively inexpensive, is used as a material for the multi-layer wiring board, and then an underfill resin is disposed between this multi-layer wiring board and a semiconductor chip. In this technique, the disposition of the underfill resin between the semiconductor chip and the multi-layer wiring board composed of organic material makes it possible to distribute a shearing stress imposed on bump bonding portions disposed between the semiconductor chip and the multi-layer wiring board. Thereby, mounting reliability is improved. This technique enables use of a multi-layer wiring board composed of inexpensive organic materials.

However, the above-described technique using an underfill resin has problems described below.

Firstly, it is difficult to recover a semiconductor chip. Since a high-performance LSI (large scale integrated circuit) is generally used as a flip chip type semiconductor chip, the semiconductor chip itself is expensive. Therefore, if a semiconductor chip is mounted on the multi-layer wiring board and then a defective site is detected in a portion other than the semiconductor chip during an electric screening process, the non-defective semiconductor chip needs to be recovered and reused. For example, if defective bonding is detected in a solder bump portion, the semiconductor chip needs to be peeled off and then bonded again. However, recovery of a semiconductor chip is technically difficult in the above-described structure of the flip chip type semiconductor device, in which an underfill resin is interposed between the semiconductor chip and the mounting board.

FIGS. 1A and 1B are sectional views showing a method of mounting a conventional semiconductor device on a multi-layer wiring board. FIG. 1A shows the semiconductor chip. As shown in FIG. 1A, outer solder electrodes 13 are formed on the bottom surface of a semiconductor chip 24. FIG. 1B shows a state that the semiconductor chip 24 is mounted. As shown in FIG. 1B, the semiconductor chip 24 is mounted and bonded onto a mounting board 25 by melting the solder bumps while the outer solder electrodes 13 are positioned on electrode portions (not shown) on the mounting board 25. An underfill resin 26 is filled between the semiconductor chip 24 and the mounting board 25. That is, the outer solder electrodes 13 are buried in the underfill resin 26.

FIG. 1C is a sectional view showing a method of recovering the semiconductor chip 24. To recover the semiconductor chip 24, as shown in FIG. 1C, the rear surface of the semiconductor chip 24 is suctioned by a heating/suctioning tool 27 for repair while heated. Then, the semiconductor chip 24 is pulled up while the bump bonding portions are being melted. Thus, the non-defective semiconductor chip 24 is removed from the mounting board 25.

FIG. 2 is a sectional view showing a state after the semiconductor chip 24 in the conventional flip chip type semiconductor device is removed from the mounting board 25. As shown in FIG. 2, when a chip is removed from a semiconductor device having an underfill resin, problems arise that the outer solder electrodes 13 remain buried in the underfill resin 26, the underfill resin 26 and the mounting board 25 are damaged and so forth. Therefore, the non-defective semiconductor chip 24 cannot be reused. With the above-described reasons, it is difficult to reuse a non-defective flip chip type semiconductor chip in the conventional technique.

Secondly, if voids exist in the underfill resin 26 or a bonding characteristic is unfavorable at the interface between the underfill resin 26 and the semiconductor chip 24 and the interface between the underfill resin 26 and the mounting board 25, a peeling phenomenon is induced at the aforementioned interfaces in a hygroscopic reflow process for a product. Thus, a non-defective product becomes defective.

Thirdly, since a process of heating to a high temperature is performed when the semiconductor chip 24 is recovered, barrier metal-bonding portions of the removed semiconductor chip 24 and the outer solder electrodes 13 as well as a passivation film (not shown) are damaged. Thus, a non-defective semiconductor chip may become defective. The passivation film is formed for the purpose of protecting the active region of the semiconductor chip 24 and composed of PI (polyimide) organic material or inorganic material such as an SiO material such as SiO, $SiO_2$ or the like. Furthermore, thermal and mechanical loads applied to the outer solder electrodes 13 are transmitted to the semiconductor chip 24, and thus a non-defective semiconductor chip 24 may become defective. In this case, peripheral devices including the mounting board 25 may also become defective.

Therefore, in reality, use of an organic material as a material for the multi-layer wiring board cannot lead to a lower cost.

When a ceramic multi-layer wiring board is used, recovery of a non-defective semiconductor chip is relatively easy since use of an underfill resin is not required due to optimization of the linear expansion coefficient of the ceramic material.

SUMMARY OF THE INVENTION

An object of the present invention is to provide a low-cost flip chip type semiconductor device in which an underfill resin is not used, mounting reliability is excellent since cracks due to a thermal stress can be prevented at the interface between a semiconductor chip and solder bumps and the semiconductor chip can be recovered, and a method of manufacturing the same.

The flip chip type semiconductor device according to the present invention comprises a semiconductor chip provided with pad electrodes, an insulating resin layer covering a semiconductor chip surface on a side on which the pad electrodes are provided, metallic posts which penetrates through this insulating resin layer and are connected to the pad electrodes and electrodes which are provided on the insulating resin layer surface and connected to the metallic posts. The metallic post has a first portion buried in the insulating resin layer and a second portion projected from the insulating resin layer. It is noted that when "metal" is referred to in the present invention, not only pure metals but also alloys are included.

In the present invention, a mounted semiconductor chip can be recovered since an underfill resin is not provided. Furthermore, since an underfill resin is not provided, there is no problem of a peeling phenomenon due to voids in the underfill resin or defective bonding between the underfill resin and a semiconductor chip or a mounting board. Furthermore, an insulating resin layer and metallic posts are disposed between the pad electrodes of the semiconductor chip and externally exposed electrodes. Ends of the metallic posts are projected from the insulating resin layer surface. Therefore, a layer composed of the metallic posts and the insulating resin layer serves as a stress relaxation layer so that thermal and mechanical loads imposed on the externally exposed electrodes can be prevented from transmitting to a semiconductor chip. Furthermore, since a contact area between the metallic post and outer solder electrode making contact with the metallic post is large and, moreover, damage to the outer solder electrode due to a horizontal stress and thereby propagation of cracks can be prevented, bond strength between the metallic post and outer solder electrode can be increased. Therefore, mounting reliability of the flip chip type semiconductor device can be improved. Consequently, a flip chip type semiconductor device from which a semiconductor chip can be recovered and which has excellent mounting reliability can be provided without using an expensive ceramic substrate.

In this flip chip type semiconductor device, centroids of the aforementioned first and second portions may be deviated from each other in a plane view. Consequently, the metallic post can be divided into two portions. Therefore, thermal and mechanical loads transmitted to the semiconductor chip via the metallic post can be further reduced and the aforementioned effect can be further enhanced.

In a method of manufacturing a flip chip type semiconductor device according to the present invention, a plurality of recessed portions are formed in the surface of a metallic substrate, and a metallic post is formed on the surface of each recessed portion. Then, this metallic post and a pad electrode of a semiconductor chip are connected, an insulating resin layer is formed by filling an insulating resin into a space between the metallic substrate and the semiconductor chip, the metallic substrate is removed and electrodes are formed on the metallic post.

In another method of manufacturing a flip chip type semiconductor device according to the present invention, a plurality of projected portions on a first surface of a metallic substrate, a plurality of projected portions corresponding to the projected portions formed on the first surface are formed on a second surface of the metallic substrate, and the projected portions formed on the first surface and pad electrodes of a semiconductor chip are connected with each other. Then, an insulating resin layer is formed by filling an insulating resin into a space between the metallic substrate and the semiconductor chip, the projected portions are partitioned by removing portions of the metallic substrate other than the projected portions and electrodes are formed on the projected portions formed on the second surface of the metallic substrate.

Consequently, the aforementioned flip chip type semiconductor device can be efficiently fabricated.

The plurality of projected portions may be formed by forming a resist for masking regions where the projected portions are to be formed and etching the metallic substrate by using this resist as a mask.

BRIEF DESCRIPTION OF THE DRAWINGS

FIGS. 5A to 5K are sectional views showing a method of manufacturing the flip chip type semiconductor device according to the embodiment in the order of manufacturing process steps;

DETAILED DESCRIPTION OF THE PREFERRED EMBODIMENTS

Hereafter, embodiments of the present invention will be described in detail with reference to the accompanying drawings. The construction, manufacturing method and effects of a flip chip type semiconductor device according to a first embodiment will be explained below. First, the construction of the flip chip type semiconductor device according to the first embodiment will be explained.

Figure 1A:
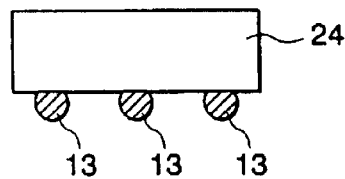
FIGS. 1A and 1B are sectional views showing a method of mounting a conventional semiconductor device on a multi-layer wiring board.
Figure 1B:
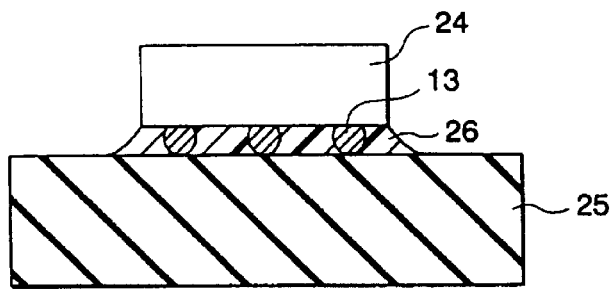
Figure 1C:
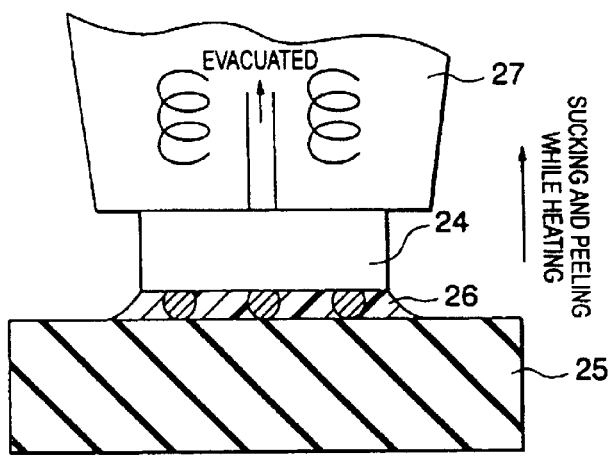
FIG. 1C is a sectional view showing a conventional method of recovering a semiconductor chip.
Figure 2:
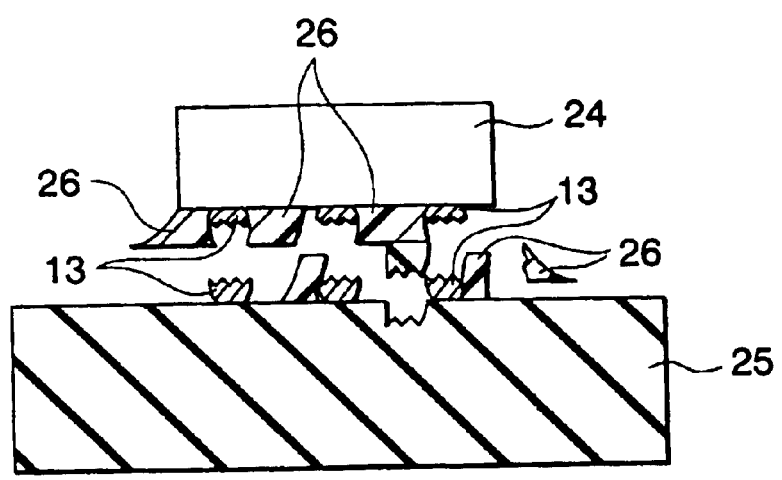
FIG. 2 is a sectional view showing a state after a semiconductor chip is removed from a mounting board in a conventional flip chip type semiconductor device.
Figure 3:
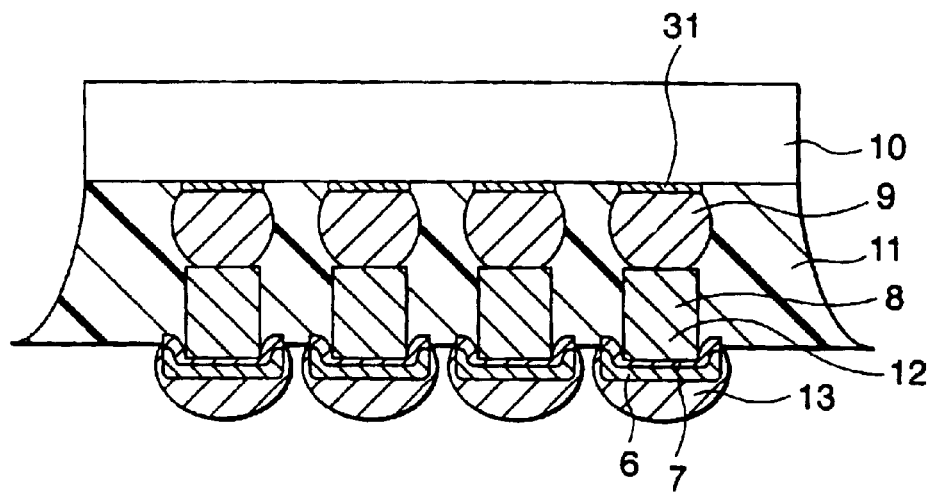
FIG. 3 is a sectional view showing a flip chip type semiconductor device according to a first embodiment of the present invention.

FIG. 3 is a sectional view showing a flip chip type semiconductor device according to the first embodiment. In the flip chip type semiconductor device of the embodiment, a semiconductor chip 10 is provided with a plurality of pad electrodes 31 on one surface thereof and a solder electrode 9 is connected to each pad electrode 31. A metallic post 8 is further connected to each solder electrode 9. An insulating resin layer 11 is coated on a surface of the semiconductor chip 10 on a side on which the pad electrodes 31 are formed. And, all of the pad electrode 31 and solder electrode 9 and part of the metallic post 8 are buried in the insulating resin layer 11. The remaining portion of the metallic post 8 is projected from the insulating resin layer 11 to form a protrusion 12. A second plating film 7 and first plating film 6 are coated on the protrusion 12 of the metallic post 8. An outer solder electrode 13 is connected to the first plating film 6. The outer solder electrode 13 is formed so as to cover the protrusion 12.

Figure 4:
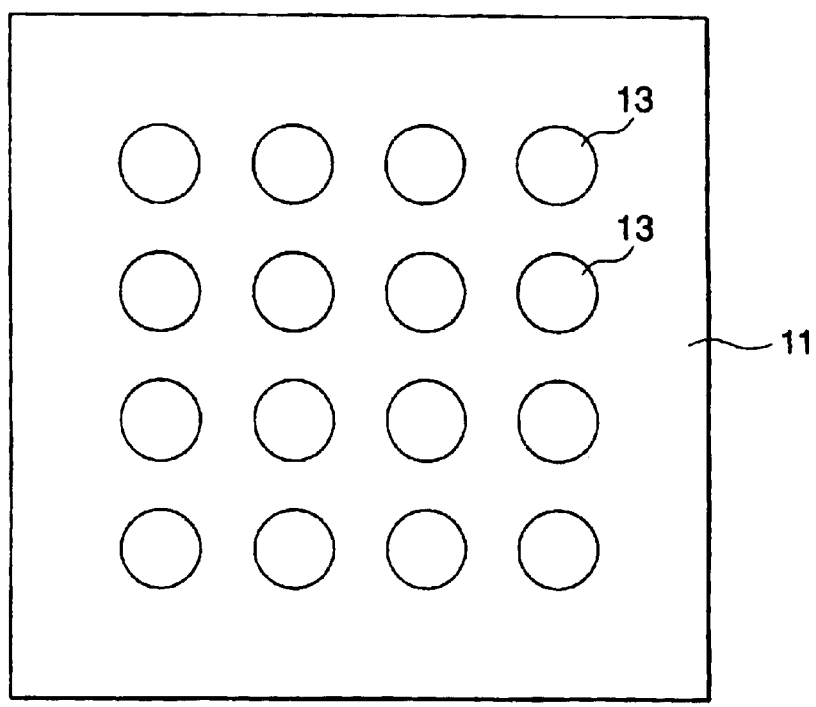
FIG. 4 is a plan view showing the flip chip type semiconductor device of the embodiment viewed from an outer solder electrode side.

FIG. 4 is a plan view showing the flip chip type semiconductor device of the embodiment viewed from the outer solder electrode 13 side. As shown in FIG. 4, in this flip chip type semiconductor device, the outer solder electrodes 13 are arranged in a matrix on the insulating resin layer 11.

In the embodiment, for example, the height of the solder electrode 9 can be made about 100 μm, the height of the metallic post 8 can be made about 100 μm, the height of the portion of the metallic post 8 buried in the insulating resin layer 11 can be made about 80 μm and the height of the portion projected from the surface of the insulating resin layer 11 can be made about 20 μm. The height of the outer solder electrode 13 can be made about 100 μm and the diameter of the metallic post 8 can be made, for example, 150 μm. Furthermore, the thickness of the semiconductor chip 10 can be made, for example, about 50 to 725 μm.

Figure 5H:
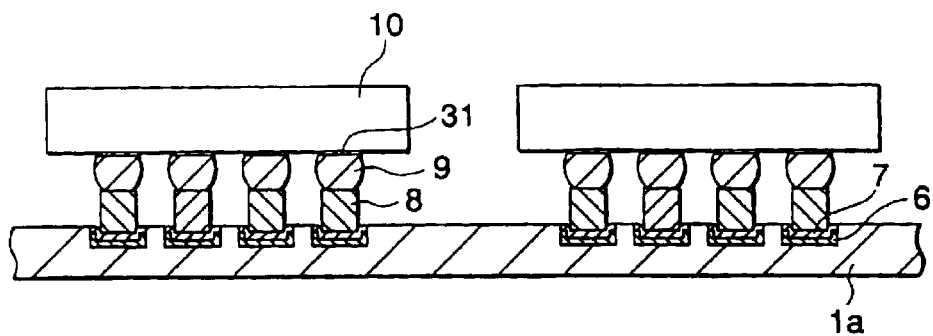

A method of manufacturing the flip chip type semiconductor device according to the embodiment will be described below. FIGS. 5A to 5K are sectional views showing the method of manufacturing the flip chip type semiconductor device according to the embodiment in the order of manufacturing process steps. As shown in FIGS. 5A and 5B, a resist 2a is formed on a surface of a metallic substrate 1a. The material of the metallic substrate 1a is not particularly limited, but copper, nickel, gold, tin, lead or an alloy containing these or the like, which can be easily etched later, is preferable. The thickness of the metallic substrate 1a is not particularly limited either, but a thickness which affects etching as little as possible and can be easily handled is preferable. Subsequently, as shown in FIG. 5C, this resist 2a is exposed and developed to form a patterned resist 4a having prescribed apertures. Then, as shown in FIG. 5D, half-etching is selectively performed by using this resist 4a as a mask to form recessed portions 30a at positions at which plating and bumps are to be formed later. This recessed portion 30a needs a size large enough to have a structure of an outer post later.

Subsequently, as shown in FIG. 5E, a first plating film 6 is formed in the recessed portion 30a. At this time, the resist 4a used in the aforementioned half-etching is utilized as a mask as it is. As a material of the first plating film 6, a metal with which only the metallic substrate 1a can be selectively etched so that the first plating film 6 remains even when the metallic substrate 1a is etched in a later process, for example, Au is used. As shown in FIG. 5F, a second plating film 7 may be formed on the first plating film 6. This second plating film 7 is formed, for example, to improve plating stability when a metallic post 8 is formed in the next process.

Subsequently, as shown in FIG. 5G, metallic posts 8 are formed by plating using the resist 4a as a mask. The material of the metallic post 8 is not particularly limited, but a material which has a favorable bonding characteristic with a chip to be mounted onto the metallic post 8 in a later process and has favorable conductivity, for example, Cu can be used. Or, solder plating may be formed on the metallic post 8.

Figure 5I:
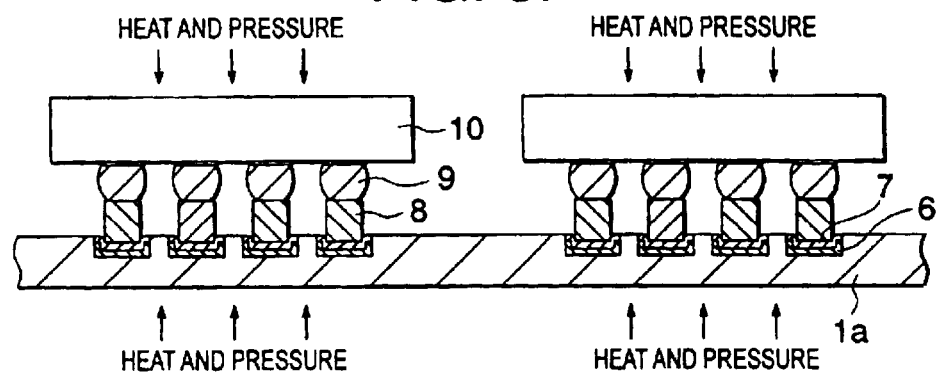
Figure 5J:
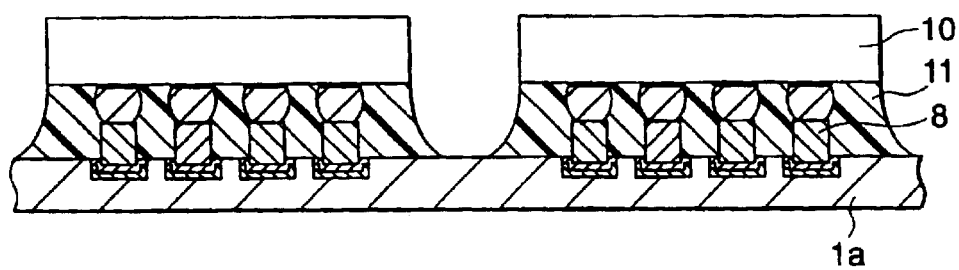
Figure 5K:
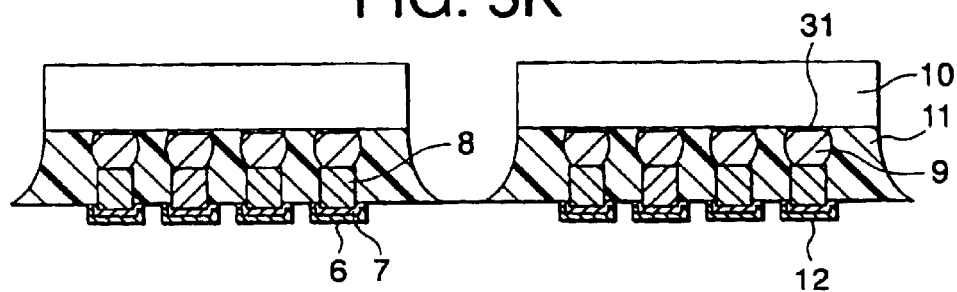

Then, as shown in FIGS. 5H and 5I, solder electrodes 9 are provided on pad electrodes 31 of a semiconductor chip 10 and the semiconductor chip 10 is mounted onto the metallic posts 8 by a chip bonder (not shown) and a reflow device (not shown) or the like. Then, the metallic posts 8 and the solder electrodes 9 are bonded by metallic bond by thermal treatment. However, if solder plating is formed on the metallic post 8, the pad electrode of the semiconductor chip 10 does not need to be provided with the solder electrode 9. Then, as shown in FIG. 5J, an insulating resin is filled between the semiconductor chip 10 and metallic substrate 1a to form an insulating resin layer 11 and cover the metallic post 8. Methods of filling the insulating resin include a method utilizing a capillary phenomenon, a transfer-sealing method and so forth. As the insulating resin, epoxy resins, silicon resins, polyimide resins, polyolefin resins, cyanate ester resins, phenol resins, naphthalene resins, fluorene resins or the like can be used. Subsequently, as shown in FIG. 5K, only the metallic substrate 1a is removed by etching.

Then, as shown in FIG. 3, a solder ball is mounted on the protrusion 12 of the metallic post 8 and bonded to the metallic post 8 by a method such as a reflow treatment or the like to form an outer solder electrode 13. By the above processes, such a flip chip type semiconductor device as shown in FIGS. 3 and 4 can be obtained.

Effects of the first embodiment will be explained below. In the embodiment, since the metallic post 8 has the protrusion 12 projected from the surface of the insulating resin layer 11, peeling of the outer solder electrode 13 from the metallic post 8 can be reliably prevented when a shearing stress is applied to the outer solder electrode 13 in the horizontal direction, as compared with a case where a protrusion 12 is not provided. That is, when a shearing stress exceeding a certain level is applied to the outer solder electrode 13, cracks occur at the interface between the first plating film 6 and the outer solder electrode 13. If the metallic post 8 does not have a protrusion 12, the cracks are propagated instantaneously and the outer solder electrode 13 peels from the metallic post 8. On the other hand, since the metallic post 8 has the protrusion 12 in the embodiment, this propagation of cracks can be prevented. Furthermore, since a contact area between the first plating film 6 and the outer solder electrode 13 is increased due to the presence of the protrusion 12, the solder bond strength is increased. Therefore, the bond strength between the metallic post 8 and the outer solder electrode 13 is improved, and thus mounting reliability of a flip chip type semiconductor device is improved.

In order to obtain the above-described effects, the height of the portion of the metallic post 8 exposed from the surface of the insulating resin layer 11, that is, the height of the protrusion 12 is preferably 7 to 50% of the height of the outer solder electrode 13, that is, the distance from the end of the outer solder electrode 13 to the surface of the insulating resin layer 11. The ratio lower than 7% results in insufficient effects of withstanding a shearing stress applied to the interface between the metallic post 8 and the outer solder electrode 13 and preventing propagation of cracks occurring at the interface. On the other hand, since the contact area between the mounting board and the solder is reduced if the ratio exceeds 50%, the bond strength is unfavorably degraded. It is more preferable that the ratio is 20 to 50%.

Furthermore, the external terminal is made higher due to the metallic post 8 and the insulating resin layer 11 in the flip chip type semiconductor device of the embodiment. Therefore, when the flip chip type semiconductor device of the the embodiment is mounted onto the multi-layer wiring board on the end user side, the stand-off height between the multi-layer wiring board and the semiconductor chip is increased. Consequently, a buffer effect is provided against a stress which occurs due to a difference between thermal expansion coefficients of the multi-layer wiring board and the flip chip semiconductor device, and thus mounting reliability of the flip chip type semiconductor device can be improved. Also, the passivation film and the active region surface under the passivation film of the semiconductor chip 10 can be protected from thermal and mechanical loads generated when the semiconductor chip 10 is recovered. In order to obtain the aforementioned effects, the height of the metallic post 8 is preferably 100 $\mu$m or higher.

Furthermore, since the metallic post 8 and the insulating resin layer 11 serve as a stress relaxation layer in the flip chip type semiconductor device of the embodiment, the underfill resin filled between semiconductor chip and multi-layer wiring board in the conventional device is not required. Therefore, if the semiconductor chip 10 is mounted and then a defect is detected in a portion other than the semiconductor chip 10, the semiconductor chip 10 can be peeled off from the mounting board, recovered and reused.

Furthermore, since the underfill resin is not provided in the flip chip type semiconductor device of the embodiment, there is no problem of a peeling phenomenon due to voids in the underfill resin or defective bonding between the underfill resin and semiconductor chip or mounting board.

Furthermore, according to the method of manufacturing the semiconductor device of the embodiment, metal plating can be easily provided to the exposed portion of the metallic post. Advantages of providing the metal plating include that an insulating oxide film can be prevented from being formed on the metallic post by providing plating using non-oxidative metal such as Au or the like and that the metallic post can be protected from a thermal stress applied to the exposed portion of the metallic post by providing plating using high-hardness metal such as Ni or the like. Consequently, mounting reliability of the semiconductor device can be further improved.

Figure 6:
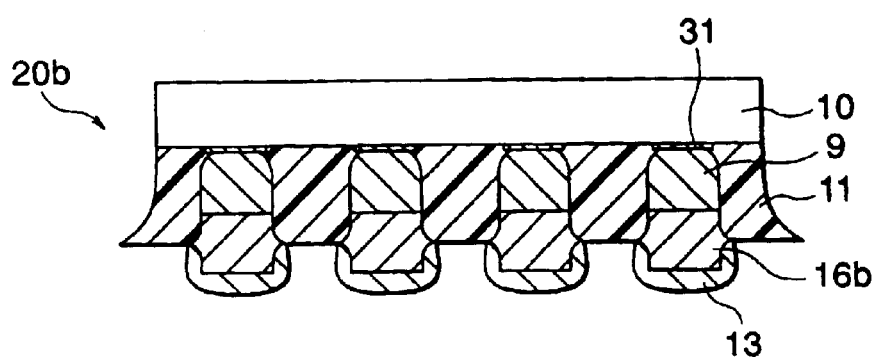
FIG. 6 is a sectional view showing a flip chip type semiconductor device according to a second embodiment of the present invention.

A second embodiment of the present invention will be described below. FIG. 6 is a sectional view showing a flip chip type semiconductor device according to the embodiment. In the flip chip type semiconductor device of the embodiment, a semiconductor chip 10 provided with a plurality of pad electrodes 31 on one surface thereof is provided and a solder electrode 9 is connected to each pad electrode 31. Furthermore, a metallic post 16b is connected to each solder electrode 9. The surface of the semiconductor chip 10 on a side on which pad electrodes 31 are formed is coated with an insulating resin layer 11 and all of the pad electrode 31 and solder electrode 9 and part of the metallic post 16b are buried in the insulating resin layer 11. The remaining portion of the metallic post 16b is projected from the insulating resin layer 11 to form a protrusion. An outer solder electrode 13 is formed so as to cover the protrusion. The plan view of this flip chip type semiconductor device viewed from the outer solder electrode 13 side is the same as shown in FIG. 4.

Figure 7A:
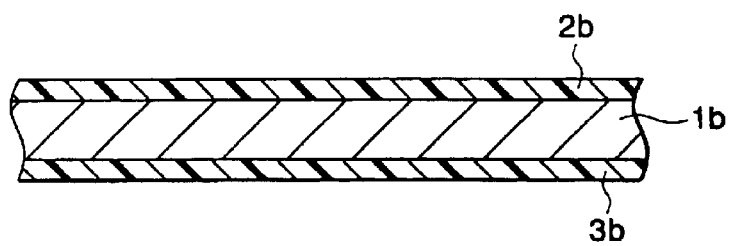
FIGS. 7A to 7F are sectional views showing a method of manufacturing the flip chip type semiconductor device according to the embodiment in the order of manufacturing process steps.
Figure 7B:
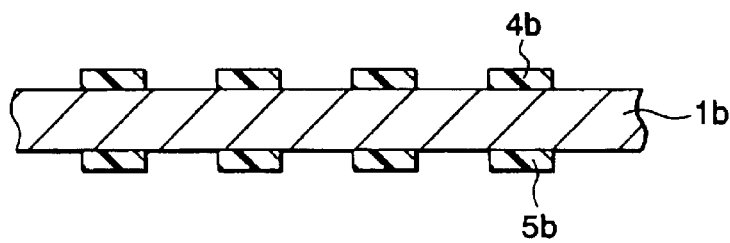

FIGS. 7A to 7F are sectional views showing a method of manufacturing the semiconductor device according to the second embodiment in the order of manufacturing process steps. First, as shown in FIG. 7A, a metallic substrate 1b is fabricated as in the case of the first embodiment. As a metal of this metallic substrate 1b, for example, Cu is used. The thickness of the metallic substrate 1b is preferably 100 $\mu$m or more. Subsequently, the front surface and the rear surface of the metallic substrate 1b are coated with resists 2b and 3b, respectively. Then, as shown in FIG. 7B, the resists 2b and 3b are exposed and developed to form patterned resists 4b and 5b.

Figure 7C:
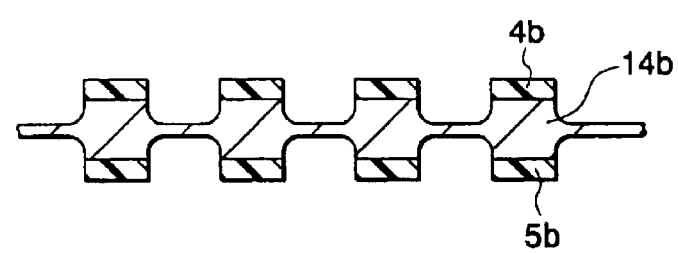

Subsequently, as shown in FIG. 7C, the metallic substrate 1b is etched from both surfaces. Consequently, a temporary substrate 14b is formed. The etching amount at this time is not particularly limited, but the etching amount of the front side (resist 4b side) determines the height of the metallic post portion covered by an insulating resin layer to be formed later. The etching amount of the rear side (resist 5b side) determines the height of the metallic post portion projected from the insulating resin layer surface. Therefore, the etching amounts are determined in consideration to these heights.

Figure 7D:
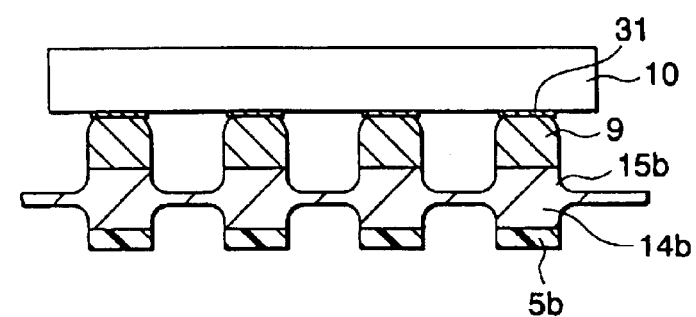

Subsequently, as shown in FIG. 7D, only the resist 4b of the front surface or the resists 4b and 5b of both surfaces are removed to expose surface portions of the temporary substrate 14b. Then, the semiconductor chip 10 is mounted onto the temporary substrate 14b so that the solder electrode 9 provided on the pad electrode 31 of the semiconductor chip 10 and the projected portion 15b of the temporary substrate 14b are brought into contact, and the solder electrode 9 and the projected portion 15b are bonded by metallic bond by means such as reflow and thermal pressing or the like.

Figure 7E:
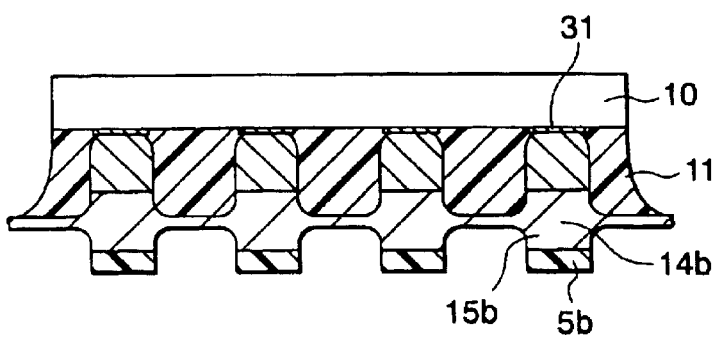
Figure 7F:
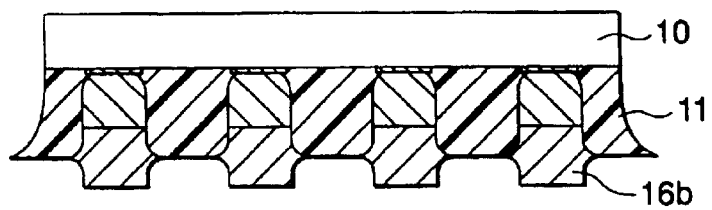

Subsequently, as shown in FIG. 7E, an insulating resin is filled between the temporary substrate 14b and the semiconductor chip 10 to form an insulating resin layer 11. Then, as shown in FIG. 7F, the rear surface of the temporary substrate 14b is etched by using the resist 5b as a mask to remove a metal between the projected portions 15b of the temporary substrate 14b and form metallic posts 16b. However, this is not applicable to the case where the resists on both sides are removed in the process shown in FIG. 7D. In this case, metal portions between the metallic posts 16b are removed by etching all of the rear surface.

Subsequently, as shown in FIG. 6, an outer solder electrode 13 is formed on the protrusion of the metallic post 16b by a reflow treatment of a solder paste or solder balls or the like to obtain the flip chip type semiconductor device of the second embodiment.

Effects of the second embodiment will be explained below. According to the embodiment, in addition to the effects obtained in the first embodiment, the end of the metallic post 16b can be projected highly from the surface of the insulating resin layer 11. Consequently, a structure can be obtained which is resistant to cracks, breaking or the like of solder balls occurring due to thermal and mechanical loads upon mounting of the device on the multi-layer wiring board. Furthermore, while the metallic post is formed by plating in the first embodiment, the metallic post is formed from the metallic substrate in the embodiment. Therefore, variations in heights of the metallic posts can be easily prevented and higher metallic posts can be formed by a method such as an etching method, which is relatively easy and inexpensive.

Figure 8:
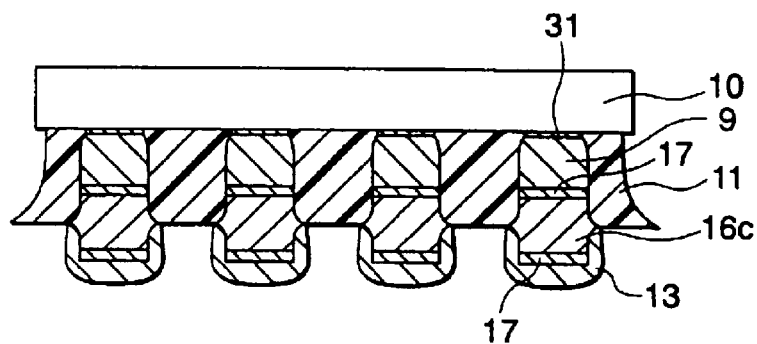
FIG. 8 is a sectional view showing a flip chip type semiconductor device according to a third embodiment of the present invention.

A third embodiment of the present invention will be explained below. FIG. 8 is a sectional view showing a flip chip type semiconductor device according to the embodiment. In the flip chip type semiconductor device of the embodiment, a semiconductor chip 10 provided with a plurality of pad electrodes 31 on one surface thereof is provided and a solder electrode 9 is connected to each pad electrode 31. Furthermore, a metallic post 16c is connected to each solder electrode 9 via a metal plating film 17. The surface of the semiconductor chip 10 on a side on which the pad electrodes 31 are formed is coated with an insulating resin layer 11 and all of the pad electrode 31 and solder electrode 9 and part of the metallic post 16c are buried in the insulating resin layer 11. The remaining portion of the metallic post 16c is projected from the insulating resin layer 11 and forms a protrusion. This protrusion is coated with a metal plating film 17 and an outer solder electrode 13 is formed so as to cover the metal plating film 17. The plan view of this flip chip type semiconductor device viewed from the outer solder electrode 13 side is the same as shown in FIG. 4.

Figure 9A:
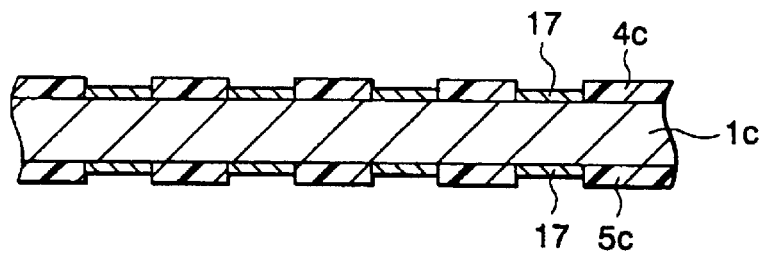
FIGS. 9A and 9B are sectional views showing a method of manufacturing the flip chip type semiconductor device according to the embodiment in the order of manufacturing process steps.
Figure 9B:
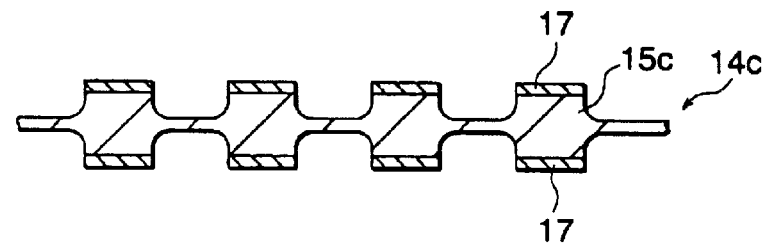

FIGS. 9A and 9B are sectional views showing a method of manufacturing the flip chip type semiconductor device according to the third embodiment in the order of manufacturing process steps. First, as shown in FIG. 9A, the front surface and the rear surface of a metallic substrate 1c are coated with resists and the resists are exposed and developed to form resists 4c and 5c whose patterns are inverted to those of the resists 4b and 5b in the second embodiment. Then, a metal plating film 17 is formed on portions on which the resists 4c and 5c are not formed by using the resists 4c and 5c as masks. As a metal constituting this metal plating film 17, a metal which is resistant to an etchant of the metallic substrate 1c is selected.

Subsequently, as shown in FIG. 9B, the resists 4c and 5c are removed and both surfaces of the metallic substrate 1c are etched by using the plating metal 17 as a mask. By the processes thus far, a temporary substrate 14c which is the same as the temporary substrate 14b of the second embodiment shown in FIG. 7C and has a metal plating layer 17 disposed on the surface of the projected portion can be formed.

Subsequently, a flip chip type semiconductor device can be obtained by the same processes as those shown in FIGS. 7D to 7F and FIG. 6 in the second embodiment. That is, the semiconductor chip 10 is mounted onto the temporary substrate 14c so that the solder electrode 9 provided on the pad electrode 31 of the semiconductor chip 10 and the projected portion 15c of the temporary substrate 14c are brought into contact. Then, the solder electrode 9 and the projected portion 15c are bonded by metallic bond by means such as reflow and thermal pressing or the like. Subsequently, an insulating resin is filled between the temporary substrate 14c and semiconductor chip 10 to form an insulating resin layer 11. Then, the rear surface of the temporary substrate 14c is etched by using the metal plating film 17 as a mask to remove a metal between the projected portions 15c of the temporary substrate 14c and form metallic posts 16c. Subsequently, an outer solder electrode 13 is formed on the portion of the metallic post 16c projected from the insulating resin layer 11 by a reflow treatment of a solder paste or solder balls or the like to obtain the flip chip type semiconductor device of the third embodiment as shown in FIG. 8.

Effects of the third embodiment will be explained below. According to the embodiment, the resist can be removed in an earlier manufacturing process as compared with the second embodiment. Therefore, the temporary substrate can be maintained for a long period and the temporary substrate can be easily handled. Furthermore, the metal plating layer 17 can be easily formed on the surface of the metallic post 16c.

Figure 10:
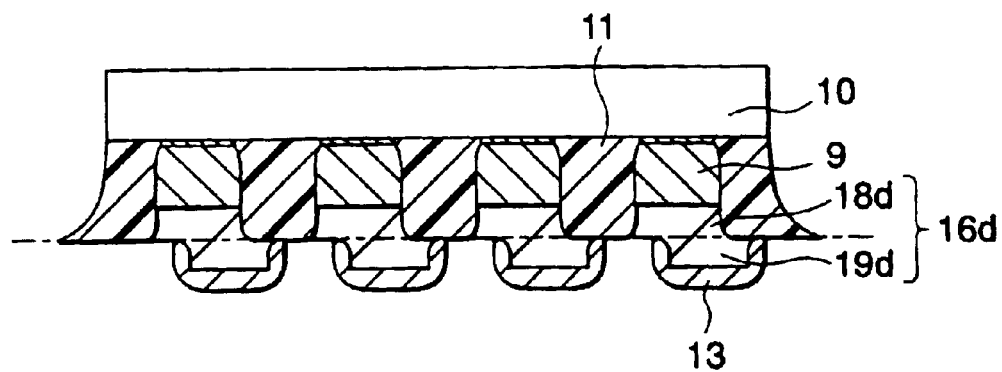
FIG. 10 is a sectional view showing a flip chip type semiconductor device according to a fourth embodiment of the present invention.

A fourth embodiment of the present invention will be explained below. FIG. 10 is a sectional view showing a flip chip type semiconductor device according to the embodiment. As shown in FIG. 10, the flip chip type semiconductor device according to the embodiment has a structure in which a portion 18d buried in an insulating resin layer 11 of a metallic post 16d and a portion 19d projected from a surface of the insulating resin layer 11 are deviated from each other.

Figure 11:
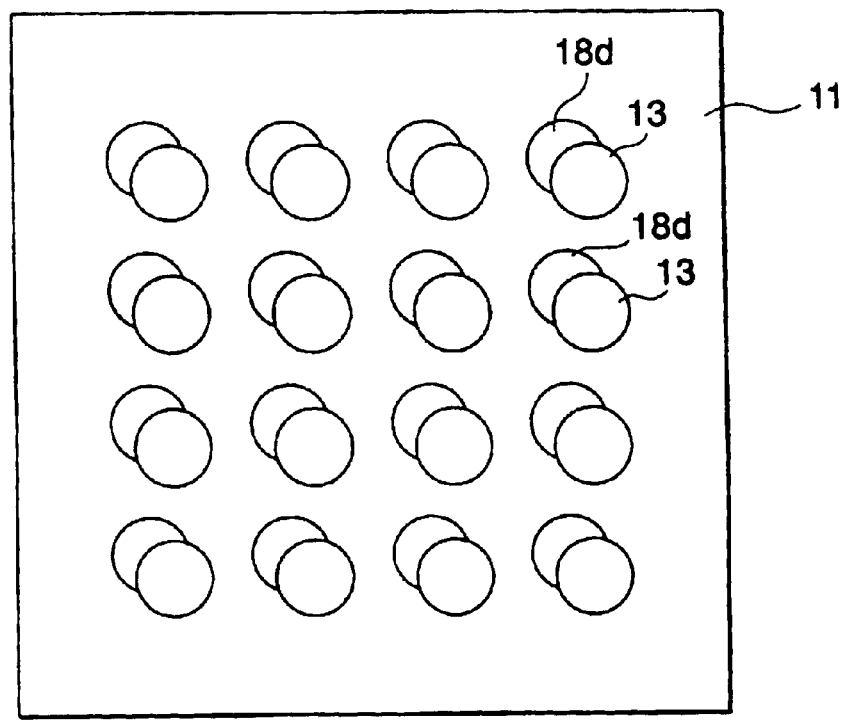
FIG. 11 is a plan view showing the flip chip type semiconductor device of the embodiment viewed from the outer solder electrode side.

FIG. 11 is a plan view of this flip chip type semiconductor device viewed from the outer solder electrode 13 side. The portions 18d of the metallic posts 16d (see FIG. 10) are buried in a matrix in the surface of the insulating resin layer 11. Also, outer solder electrodes 13 are disposed in a matrix corresponding to the portions 18d. Respective portions 18d and respective outer solder electrodes 13 are deviated from each other. The construction of the flip chip type semiconductor device according to the embodiment other than the above is the same as the construction of the flip chip type semiconductor device according to the second embodiment.

Figure 12A:
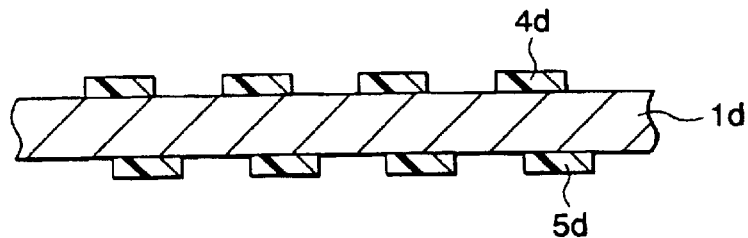
FIGS. 12A to 12G are sectional views showing a method of manufacturing the flip chip type semiconductor device according to the embodiment in the order of manufacturing process steps.

FIGS. 12A to 12G are sectional views showing a method of manufacturing the flip chip type semiconductor device according to the fourth embodiment in the order of manufacturing process steps. First, as shown in FIG. 12A, both the front surface and the rear surface of a metallic substrate 1d are coated with resists and the resists are exposed and developed to form patterned resists 4d and 5d. At this time, apertures of the resists in the front surface and the rear surface are deviated. Positions of the apertures of the resist 5d need to correspond to positions of the apertures of the resist 4d, but the direction and distance of deviation can be arbitrarily set.

Figure 12B:
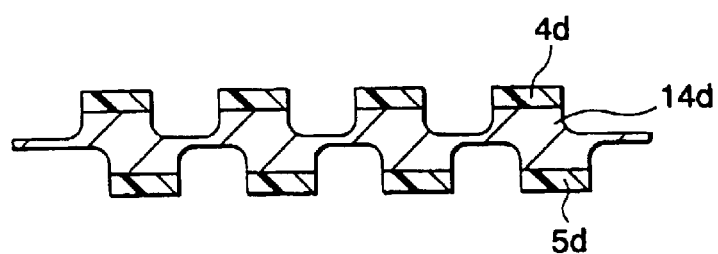

Subsequently, the front surface and the rear surface of the metallic substrate 1d are selectively etched by using the resists 4d and 5d, respectively, as masks to obtain such a temporary substrate 14d as shown in FIG. 12B.

Figure 12C:
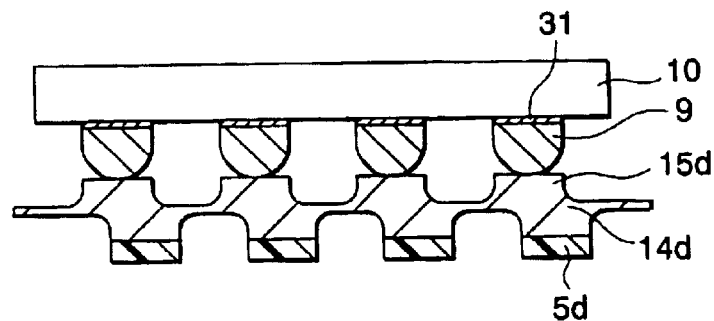
Figure 12D:
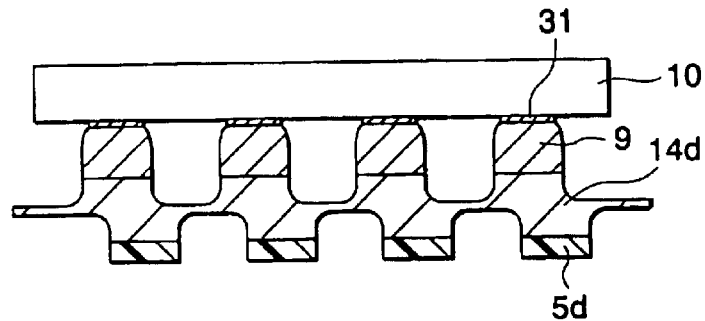
Figure 12E:
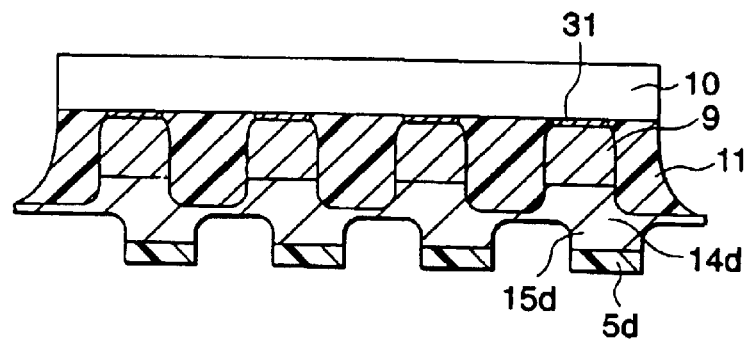
Figure 12F:
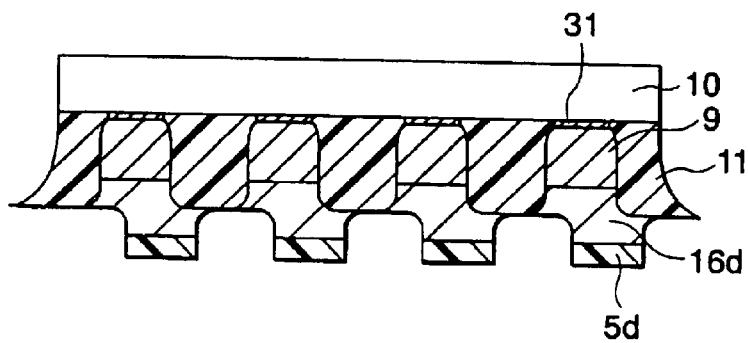
Figure 12G:
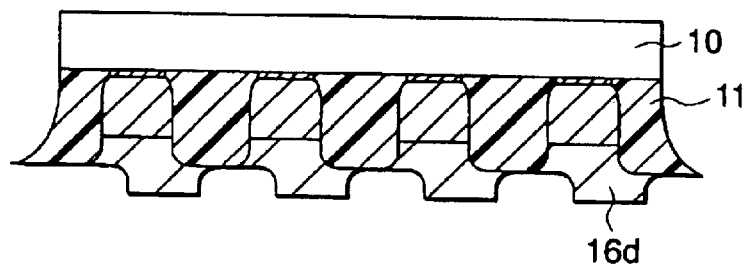

The subsequent processes are the same as those in the second and third embodiments. That is, as shown in FIG. 12C, the resist 4d formed on the front surface of the temporary substrate 14d is removed to expose the surface portion of the temporary substrate 14d. Subsequently, a semiconductor chip 10 is mounted onto the temporary substrate 14d so that the solder electrode 9 formed on the pad electrode 31 of the semiconductor chip 10 and the projected portion 15d of the temporary substrate 14d are brought into contact with each other. Subsequently, as shown in FIG. 12D, the solder electrode 9 is bonded by metallic bond to the temporary substrate 14d by means such as reflow and thermal pressing or the like. Then, as shown in FIG. 12E, an insulating resin is filled between the temporary substrate 14d and semiconductor chip 10 to form an insulating resin layer 11. Subsequently, as shown in FIG. 12F, the rear surface of the temporary substrate 14d is etched by using the resist 5d as a mask to remove the metal between the projected portions 15d of the temporary substrate 14d and form metallic posts 16d. Then, as shown in FIG. 12G, the resist 5d is removed.

Subsequently, as shown in FIG. 10, an outer solder electrode 13 is formed on the exposed portion of the metallic post 16d by a reflow treatment of a solder paste or solder balls to obtain the flip chip type semiconductor device of the embodiment.

Effects of the fourth embodiment will be explained. In the flip chip type semiconductor device of the embodiment, the metallic post 16d is composed of two portions 18d and 19d, which are deviated from each other. Therefore, a stress relaxation property at the time of reflow or the like can be improved. Thus, thermal and mechanical stresses applied to the exposed portion of the metallic post 16d can be prevented from transmitting to the semiconductor chip 10.

Furthermore, in the embodiment, the processes shown in FIGS. 12A and 12B until the temporary substrate 14d is formed can be substituted for the processes shown in FIGS. 9A and 9B, in which the metal plating film is formed and then etched to form the temporary substrate in the third embodiment.

Figure 13:
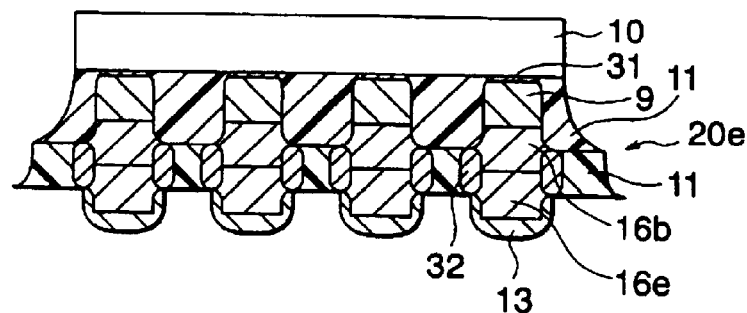
FIG. 13 is a sectional view showing a flip chip type semiconductor device according to a fifth embodiment of the present invention.

A fifth embodiment of the present invention will be explained below. FIG. 13 is a sectional view showing a flip chip type semiconductor device according to the embodiment. In the flip chip type semiconductor device 20e of the embodiment, a semiconductor chip 10 provided with a plurality of pad electrodes 31 on one surface thereof is provided and a solder electrode 9 is connected to each pad electrode 31. One end of a metallic post 16b is connected to each solder electrode 9 while a metallic post 16e is connected to the other end of the metallic post 16b by a solder 32. The surface of the semiconductor chip 10 on a side on which the pad electrodes 31 are formed is coated with an insulating resin layer 11 and all of the pad electrode 31, solder electrode 9 and metallic post 16b and part of the metallic post 16e are buried in the insulating resin layer 11. The remaining portion of the metallic post 16e is projected from the insulating resin layer 11 and forms a protrusion. Furthermore, an outer solder electrode 13 is formed so as to cover this protrusion. That is, the pad electrode 31, solder electrode 9, metallic past 16b, metallic post 16e and outer solder electrode 13 are connected in series in this order. Since the metallic post 16e is formed so as to stack on the metallic post 16b in the flip chip type semiconductor device 20e, the distance between the solder electrode 9 and outer solder electrode 13 is increased. On the other hand, a plan view of this flip chip type semiconductor device viewed from the outer solder electrode 13 side is the same as the one shown in FIG. 4.

Figure 14A:
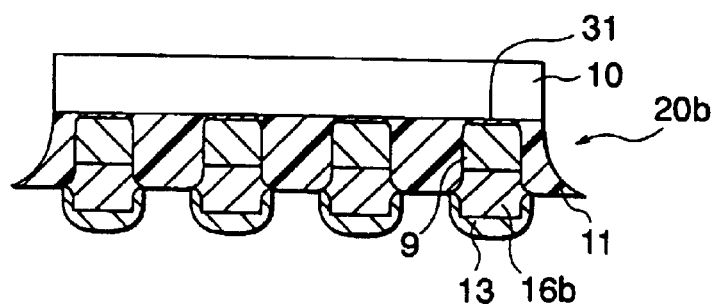
FIGS. 14A to 14C are sectional views showing a method of manufacturing the flip chip type semiconductor device according to the embodiment in the order of manufacturing process steps.
Figure 14B:
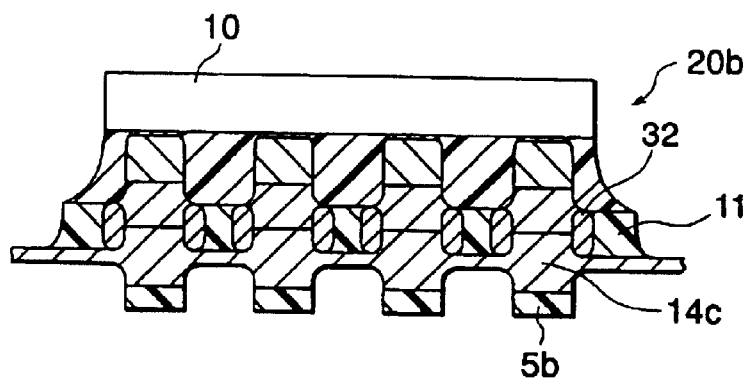
Figure 14C:
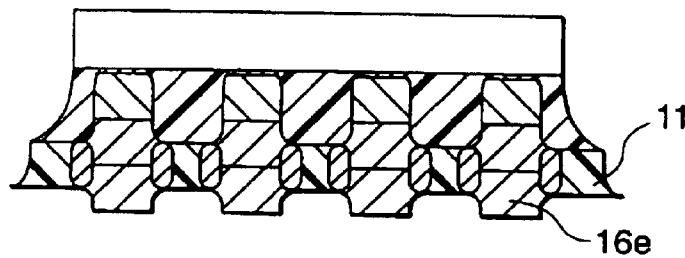

FIGS. 14A to 14C are sectional views showing a method of manufacturing the semiconductor device according to the fifth embodiment in the order of manufacturing process steps. First, a flip chip type semiconductor device shown in the second embodiment is fabricated. That is, as shown in FIG. 7A, the front surface and the rear surface of a metallic substrate 1b are coated with resists 2b and 3b, respectively, and, as shown in FIG. 7B, the resists 2b and 3b are exposed and developed to form patterned resists 4b and 5b. Subsequently, as shown in FIG. 7C, the metallic substrate 1b is etched from both surfaces to form a temporary substrate 14b. Then, as shown in FIG. 7D, the resist 4b on the front surface is removed to expose the surface portion of the temporary substrate 14b. The semiconductor chip 10 is mounted so that the solder electrode 9 on the chip side and the projected portion 15b of the temporary substrate 14b are brought into contact and bonded by metallic bond by means such as reflow and thermal pressing or the like. Then, as shown in FIG. 7E, an insulating resin is filled between the temporary substrate 14b and semiconductor chip 10 to form an insulating resin layer 11. Subsequently, as shown in FIG. 7F, the rear surface of the temporary substrate 14b is etched by using the resist 5b as a mask to form a metallic post 16b. Then, as shown in FIG. 8, an outer solder electrode 13 is formed on the exposed portion of the metallic post 16b by reflow treatment or the like of a solder paste or solder balls to obtain a flip chip type semiconductor device 20b.

Subsequently, as shown in FIGS. 14A and 14B, the temporary substrate 14b is bonded to the flip chip type semiconductor device 20b by utilizing the solder 32 constituting the outer solder electrode 13. Subsequently, an insulating resin is filled between the flip chip type semiconductor device 20b and the temporary substrate 14c to form an insulating resin layer 11. Then, as shown in FIG. 14C, etching is performed from the temporary substrate 14c side to form a metallic post 16e. Further, the resist 5b on the temporary substrate 14c is removed.

Subsequently, as shown in FIG. 13, an outer solder electrode 13 is formed on the protrusion of the metallic post 16e by a reflow treatment or the like of a solder paste or solder balls to obtain the flip chip type semiconductor device 20e of the fifth embodiment.

Effects of the fifth embodiment will be explained below. According to the embodiment, since the distance between the solder electrode 9 on the semiconductor chip side and the outer solder electrode 13 can be increased, an effect of distributing stresses such as a thermal stress and the like is enhanced and thus mounting reliability can be further improved.

Furthermore, the height of the metallic post can be further increased by repeating the manufacturing processes in accordance with the fifth embodiment. In the embodiment, the flip chip type semiconductor device 20b is first fabricated by the method shown in the second embodiment, but the flip chip type semiconductor device fabricated by the method shown in the first, third or fourth embodiment or the sixth or seventh embodiment described later can also be used. In the embodiment, the processes of forming the temporary substrate 14b can also be substituted for the processes in the third embodiment shown in FIGS. 9A and 9B, in which the metal plating film is formed and then etched to form a temporary substrate.

Figure 15:
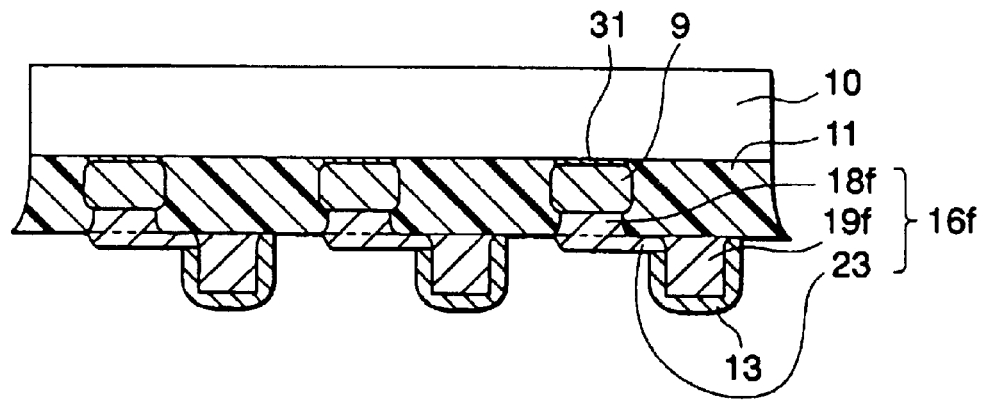
FIG. 15 is a sectional view showing a flip chip type semiconductor device according to a sixth embodiment of the present invention.

A sixth embodiment of the present invention will be explained below. FIG. 15 is a sectional view showing a flip chip type semiconductor device according to the embodiment. As shown in FIG. 15, in the flip chip type semiconductor device according to the sixth embodiment, a metallic post 16f is constituted by a portion 18f buried in an insulating resin layer 11, a portion 19f projected from the surface of the insulating resin 11 and metal wiring 23 disposed on the surface of the insulating resin 11. The side face of the portion 18f is located outside the side face of the portion 19f in a plane view while the portion 18f is connected to the portion 19f by metal wiring 23. Furthermore, an outer solder electrode 13 is formed so as to cover the portion 19f.

Figure 16:
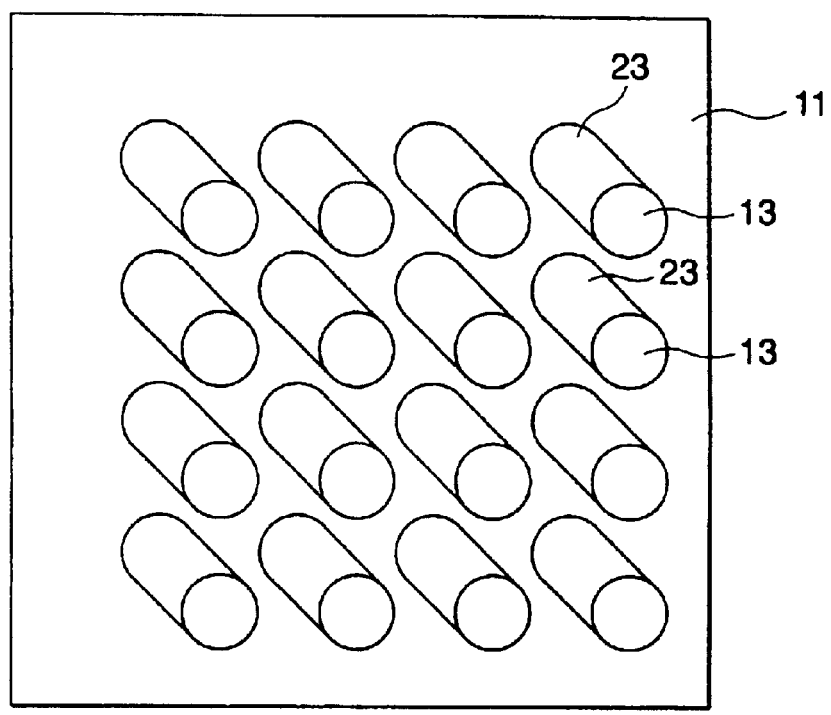
FIG. 16 is a plan view showing the flip chip type semiconductor device of the embodiment viewed from the outer solder electrode side.

FIG. 16 is a plan view of this flip chip type semiconductor device viewed from the outer solder electrode 13 side. As shown in FIG. 16, a plurality of outer solder electrodes 13 are arranged in a matrix on the insulating resin layer 11 in the flip chip type semiconductor device of the embodiment. Metal wiring 23 is connected to each outer solder electrode 13. The construction of the flip chip type semiconductor device according to the embodiment other than the above is the same as that of the flip chip type semiconductor device of the above-described second embodiment.

Figure 17A:
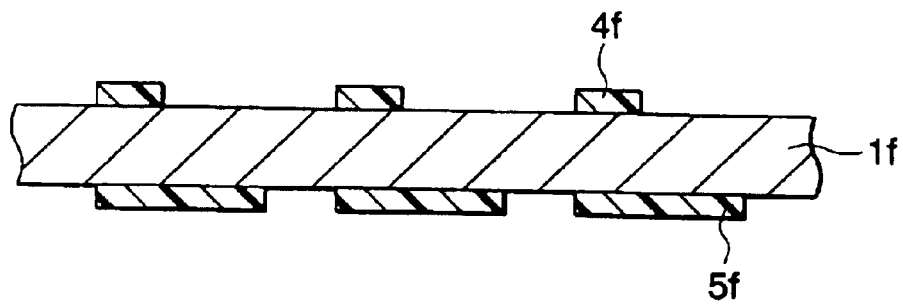
FIGS. 17A to 17F are sectional views showing a method of manufacturing the flip chip type semiconductor device according to the embodiment in the order of manufacturing process steps.
Figure 17B:
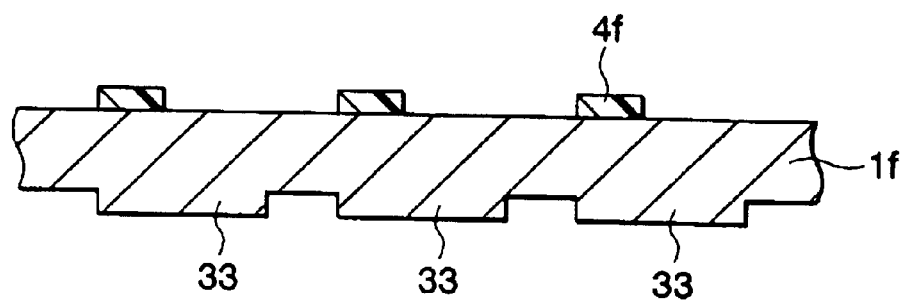

A method of manufacturing the flip chip type semiconductor device of the sixth embodiment will be described below. FIGS. 17A to 17F are sectional views showing a method of manufacturing the semiconductor device according to the sixth embodiment in the order of manufacturing process steps. The front surface and the rear surface of a metallic substrate 1f are coated with resists and the resists are exposed and developed to form patterned resists 4f and 5f as shown in FIG. 17A. Then, as shown in FIG. 17B, the rear surface is etched by using the resist 5f as a mask. Consequently, the metallic substrate 1f is formed in a shape that an island-like projected portion 33 is formed on the rear surface. Subsequently, the resist 5f is removed.

Or, the same construction can be obtained by forming a resist inverted to the resist pattern of the resist 5f, performing plating on the rear surface, removing the resist of the rear surface and then performing etching by using the plating film as a mask.

Figure 17C:
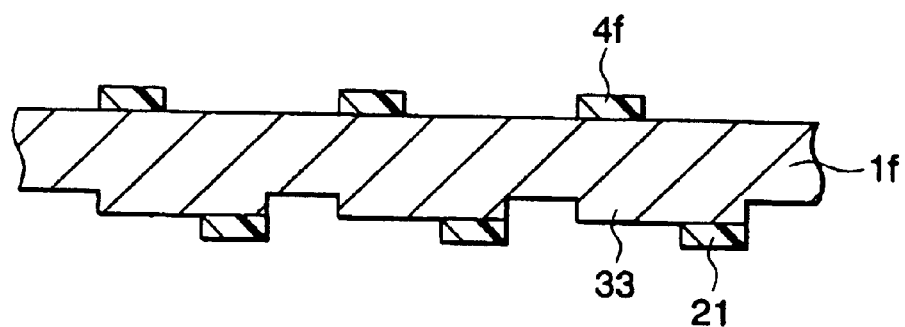
Figure 17D:
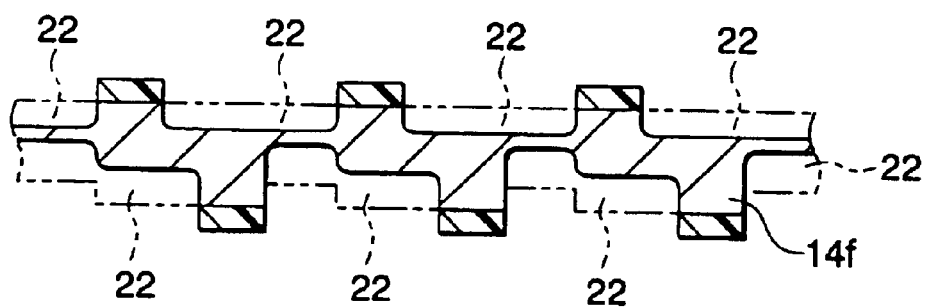

Subsequently, as shown in FIG. 17C, a resist 21 is formed at a position deviated from the resist 4f on the island-like projected portion 33 formed on the rear surface. Then, as shown in FIG. 17D, regions 22 on the front surface and the rear surface are etched by using the resists 4f and 21 as masks to obtain a temporary substrate 14f.

Figure 17E:
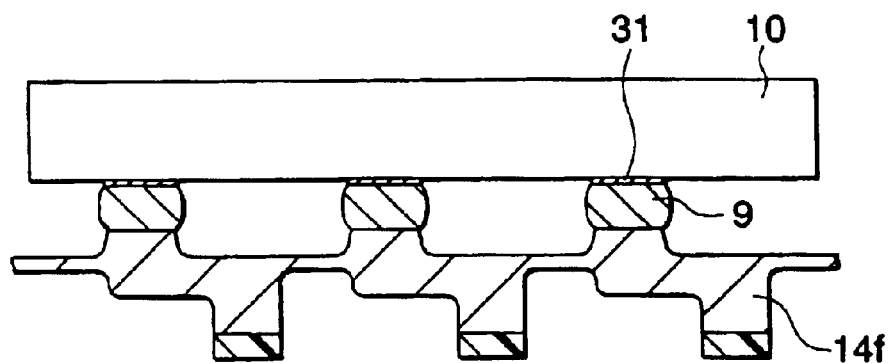
Figure 17F:
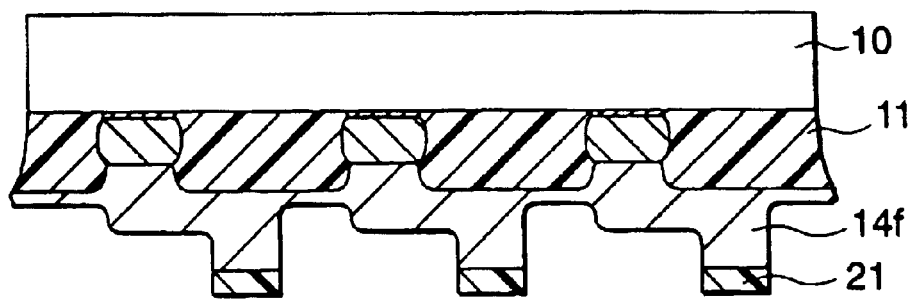

Subsequently, as shown in FIG. 17E, a semiconductor chip 10 is mounted on the temporary substrate 14f and the semiconductor chip 10 is bonded to the temporary substrate 14f. Subsequently, as shown in FIG. 17F, an insulating resin layer 11 is provided between the semiconductor chip 10 and temporary substrate 14f. Subsequently, as shown in FIG. 15, the rear surface of the temporary substrate 14f is selectively etched by using the resist 21 as a mask to partition the metallic post 16f. Further, the resist 21 is removed. Then, an outer solder electrode 13 is formed so as to cover the portion 19f of the metallic post 16f projected from the insulating resin layer 11 to obtain the flip chip type semiconductor device 20f of the sixth embodiment.

Effects of the sixth embodiment will be explained below. According to the embodiment, the externally exposed portion 19f of the metallic post 16f and the portion 18f buried in the insulating resin are connected via metal wiring 23. Consequently, an effect of relaxing a thermal stress generated at the time of reflow or the like can be further improved. An effect of preventing thermal and mechanical stresses applied to the externally exposed portion from being directly transmitted to the semiconductor chip 10 can also be further improved.

Figure 18A:
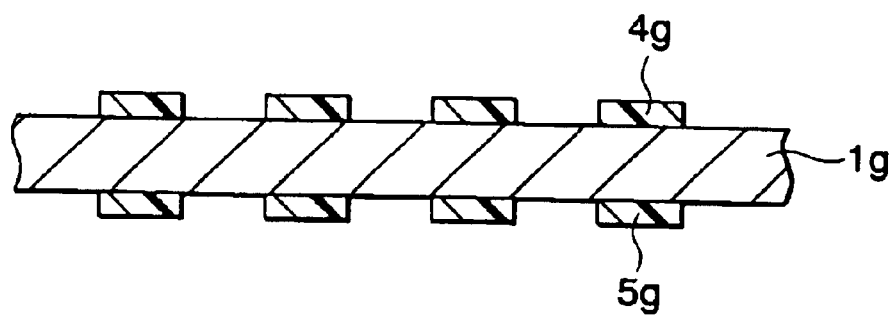
FIGS. 18A to 18F are sectional views showing a method of manufacturing a flip chip type semiconductor device according to a seventh embodiment of the present invention in the order of manufacturing process steps.
Figure 18B:
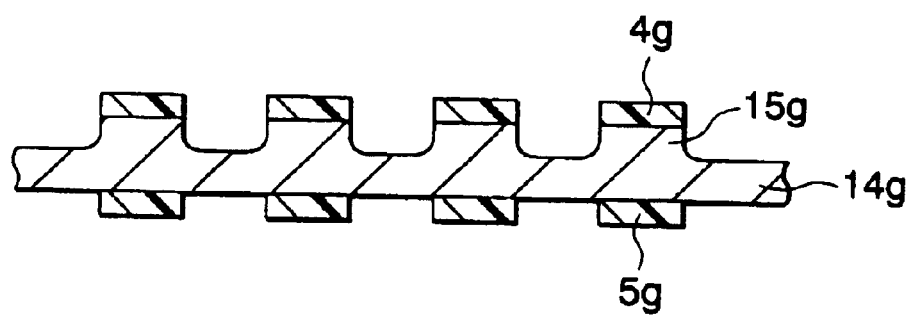
Figure 18C:
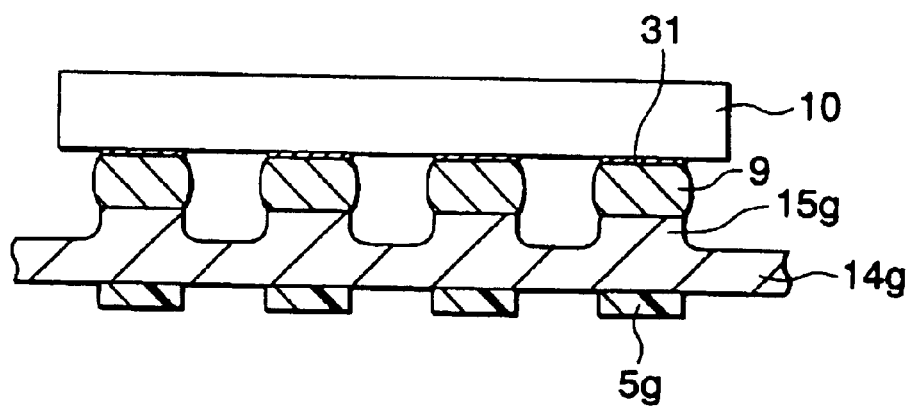

A seventh embodiment of the present invention will be explained below. FIGS. 18A to 18F are sectional views showing a method of manufacturing a flip chip type semiconductor device according to the seventh embodiment in the order of manufacturing process steps. According to the method of the embodiment, various forms of flip chip type semiconductor devices can be fabricated. The method of manufacturing a flip chip type semiconductor device of the seventh embodiment will be described as an example thereof with reference to a case where the flip chip type semiconductor device 20b shown in the second embodiment is fabricated. First, as shown in FIG. 18A, resists 4g and 5g are formed on both sides of a metallic substrate 1g as in the case of the second embodiment. Subsequently, only the surface of the metallic substrate 1g is subjected to half-etching by using the resist 4g as a mask and a temporary substrate 14g having a projected portion 15g formed on a surface thereof is fabricated as shown in FIG. 18B. Then, as shown in FIG. 18C, the semiconductor chip 10 is placed on the surface of the temporary substrate 14g so that a solder electrode 9 formed on a pad electrode 31 of a semiconductor chip 10 is brought into contact with the projected portion 15g. Then, the solder electrode 9 is heated so that the semiconductor chip 10 is bonded to the temporary substrate 14g.

Figure 18D:
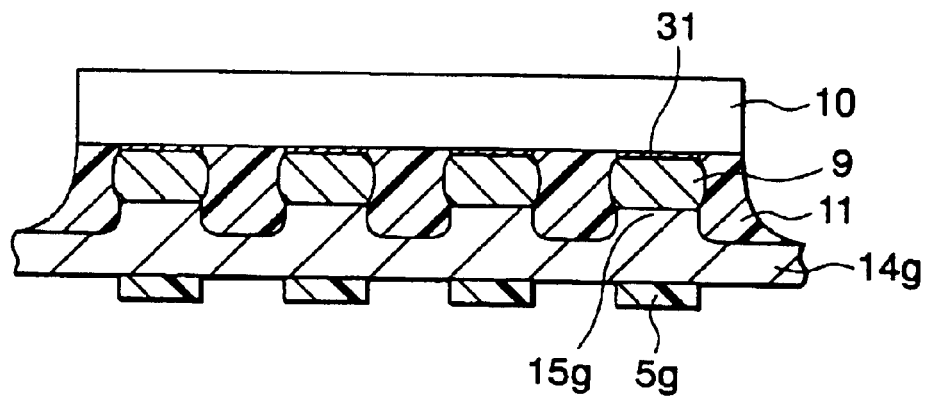
Figure 18E:
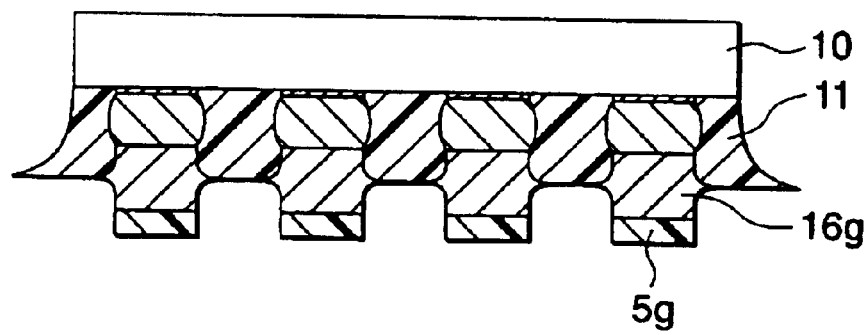
Figure 18F:
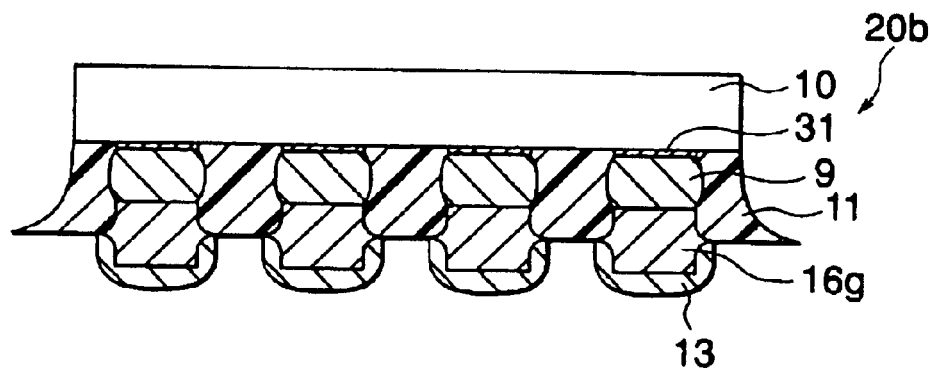

Subsequently, as shown in FIG. 18D, an insulating resin layer 11 is formed between the semiconductor chip 10 and temporary substrate 14g. Subsequently, as shown in FIG. 18E, etching is performed from the rear surface by using the resist 5g as a mask. Consequently, metal is removed from the portion other than the projected portion 15g of the metallic substrate 14g to form a metallic post 16g. Then, as shown in FIG. 18F, the resist 5g is removed and the outer solder electrode 13 is formed to obtain the flip chip type semiconductor device 20b. The construction of the flip chip type semiconductor device obtained by the embodiment is the same as the one obtained by the second embodiment.

Effects of the seventh embodiment will be explained below. In the embodiment, after the processes of mounting the semiconductor chip 10 and forming the insulating resin layer 11, the rear surface of the temporary substrate 14g is etched. Consequently, the strength of the temporary substrate 14g can be maintained until the insulating resin layer 11 is formed. As a result, handling of the temporary substrate 14g can be improved. Furthermore, the etching amount when the temporary substrate 14g is formed does not need to be precisely controlled. As a result, the flip chip type semiconductor device can be easily fabricated and the fabrication time can be shortened.

In the embodiment, fabrication of the flip chip type semiconductor device shown in the second embodiment is exemplified, but the method shown in the embodiment is applicable to a case where the flip chip type semiconductor devices shown in the third to sixth embodiments are fabricated.

Figure 19A:
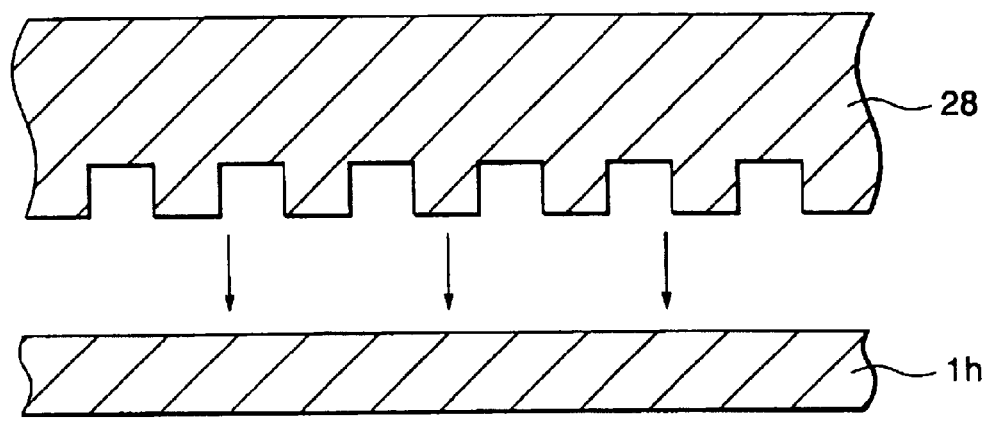
FIGS. 19A and 19B are sectional views showing a method of manufacturing a flip chip type semiconductor device according to an eighth embodiment of the present invention in the order of manufacturing process steps.
Figure 19B:
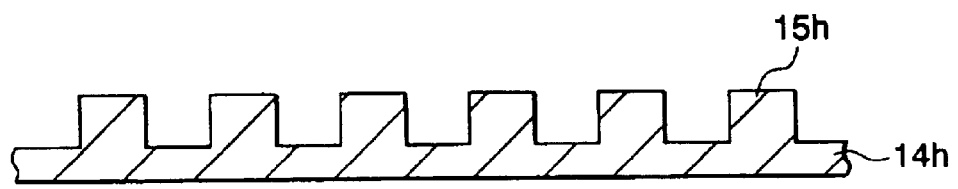

An eighth embodiment of the present invention will be explained. FIGS. 19A and 19B are sectional views showing a method of manufacturing a semiconductor device according to the eighth embodiment in the order of manufacturing process steps. The method of manufacturing a flip chip type semiconductor device according to the eighth embodiment will be described by exemplifying the case where the same flip chip type semiconductor device as shown in the second embodiment is fabricated. First, as shown in FIG. 19A, the surface of a metallic substrate 1h is pressed by a mold 28 having a recessed portion. Consequently, as shown in FIG. 19B, a temporary substrate 14h having a projected portion 15h is fabricated. Then, the semiconductor chip is placed on the surface of temporary substrate 14h, heated and bonded and an insulating resin is filled between the semiconductor chip and the temporary substrate 14h to form an insulating resin layer. Subsequently, etching is performed on the whole rear surface and metal is removed from the portion other than the projected portion 15h of the metallic substrate 1h to form a metallic post. Then, an outer solder electrode is formed to obtain the flip chip type semiconductor device.

The construction of the flip chip type semiconductor device obtained by the embodiment is the same as the one obtained by the second embodiment shown in FIG. 6.

Effects of the eighth embodiment will be explained below. According to the manufacturing method of the embodiment, processes of forming the resist pattern and etching can be omitted when the temporary substrate is formed. As a result, the fabrication time can be shortened.

What is claimed is:

1. A method of manufacturing a flip chip type semiconductor device comprising the steps of:
    forming a plurality of first projected portions on a first surface of metallic substrate;
    forming a plurality of second projected portions opposite to the first projected portions formed on said first surface on a second surface of said metallic substrate;
    connecting said first projected portions formed on said first surface and a pad electrode of a semiconductor chip wherein a surface of said semiconductor chip on which said pad electrode is formed faces said first surface of said metallic substrate;
    filling an insulating resin into a space between said metallic substrate and said semiconductor chip to form an insulating resin layer;
    removing a portion other than said first and second projected portions of said metallic substrate to partition said first and second projected portions; and
    forming electrodes on the second projected portions formed on the second surface of said metallic substrate.

2. The method of manufacturing a flip chip type semiconductor device according to claim 1, wherein said plurality of projected portions are formed by the steps of:
    forming a resist for masking regions on which said projected portion are to be formed; and
    etching said metallic substrate by using said resist as a mask.

3. The method of manufacturing a flip chip type semiconductor device according to claim 1, wherein said plurality of projected portions are formed by the steps of:
    forming a resist having apertures in regions on which said projected portions are to be formed;
    forming a metal plating film on said metallic substrate surface exposed from said apertures; and
    etching said metallic substrate by using said metal plating film as a mask.

4. The method of manufacturing a flip chip type semiconductor device according to claim 1, wherein said plurality of projected portions on said first surface are formed by forming recessed and projected portions in said first surface of said metallic substrate by subjecting said metallic substrate to press-molding.

5. The method of manufacturing a flip chip type semiconductor device according to claim 1, wherein the regions on which the projected portions are formed on the first surface are deviated from those on the second surface.

6. The method of manufacturing a flip chip type semiconductor device according to claim 1, wherein said plurality of projected portions are formed by the steps of:
    selectively etching said second surface of said metallic substrate;
    etching said second surface by using a first resist for masking part of the region of said second surface which is not etched as a mask; and
    etching said first surface by using a second resist for masking a region of said first surface which is on the region of said second surface not etched by the first etching and deviated from the region not etched by the second etching in a plane view as mask.

7. The method of manufacturing a flip chip type semiconductor device according to claim 1, wherein said insulating resin layer is formed and then the plurality of projected portions are formed on said second surface.

8. A method of manufacturing a flip chip type semiconductor device comprising the steps of:
    forming a plurality of projected portions on a first surface of a metallic substrate;
    forming a plurality of projected portions opposite to the projected portions formed on said first surface on a second surface of said metallic substrate;
    connecting said projected portion formed on said first surface and a pad electrode of a semiconductor chip;
    filling an insulating resin into a space between said metallic substrate and said semiconductor chip to form an insulating resin layer;
    removing a portion other than said projected portions of said metallic substrate to partition said projected portions;
    forming electrodes on the projected portions formed on the second surface of said metallic substrate;
    bonding said electrodes and second projected portions provided on a second metallic substrate, respectively, after forming said electrodes;
    forming a second insulating resin layer by filling an insulating resin into a space between said second metallic substrate and said insulating resin layer;
    partitioning said second projected portions by removing a portion of said second metallic substrate other than said second projected portions; and
    forming second electrodes on said second projected portions.

* * * * *